(12) United States Patent
Shin et al.

(10) Patent No.: US 10,563,299 B2
(45) Date of Patent: Feb. 18, 2020

(54) HEATING ROLLER AND FILM PRODUCTION METHOD

(71) Applicant: Sumitomo Chemical Company, Limited, Tokyo (JP)

(72) Inventors: Akihiko Shin, Daegu (KR); Koichiro Watanabe, Niihama (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 0 days.

(21) Appl. No.: 15/353,815

(22) Filed: Nov. 17, 2016

(65) Prior Publication Data

US 2017/0145559 A1 May 25, 2017

(30) Foreign Application Priority Data

Nov. 20, 2015 (JP) ................................. 2015-227976

(51) Int. Cl.
| | |
|---|---|
| *B05C 1/00* | (2006.01) |
| *C23C 14/58* | (2006.01) |
| *B01D 1/00* | (2006.01) |
| *H01M 2/14* | (2006.01) |
| *H01M 10/60* | (2014.01) |

(Continued)

(52) U.S. Cl.
CPC ............ *C23C 14/5806* (2013.01); *B01D 1/00* (2013.01); *H01M 2/145* (2013.01); *H01M 10/60* (2015.04); *B05C 1/003* (2013.01); *B05C 11/1042* (2013.01); *B05D 3/0254* (2013.01); *B29C 37/0092* (2013.01); *D21G 1/0266* (2013.01);

(Continued)

(58) Field of Classification Search
CPC ... B05C 1/003; B05C 11/1042; D21G 1/0266; D21F 5/02; D21F 5/022; D21F 5/028; B05D 3/0254; F26B 11/02; F28F 5/02
USPC ............ 427/115, 366; 118/60, 101, DIG. 15; 429/46
See application file for complete search history.

(56) References Cited

U.S. PATENT DOCUMENTS 3,619,539 A * 11/1971 Taylor .................... D06C 15/08
165/104.25
3,838,734 A * 10/1974 Kilmartin .............. D06C 15/08
165/90

(Continued)

FOREIGN PATENT DOCUMENTS

| CN | 203403197 U | 1/2014 |
|---|---|---|
| JP | 59-50707 U1 | 4/1984 |

(Continued)

OTHER PUBLICATIONS

Office Action dated Oct. 21, 2019 in CN Application No. 201611027261.8.

*Primary Examiner* — Brian K Talbot
(74) *Attorney, Agent, or Firm* — Panitch Schwarze Belisario & Nadel LLP

(57) ABSTRACT

A drying roller includes: a cylindrical member for drying a separator original sheet, with hot water which is supplied into the cylindrical member and ejected from inside the cylindrical member, the separator original sheet being wrapped on an outer peripheral surface of the cylindrical member; and a discharge pipe for discharging the hot water toward one inner end surface of the cylindrical member, the heating medium being discharged at a position where a distance to the one end surface of the cylindrical member is longer than a distance to the other inner end surface of the cylindrical member.

8 Claims, 8 Drawing Sheets

(51) Int. Cl.
    *H01M 2/16*     (2006.01)
    *H01M 10/0525*     (2010.01)
    *B29C 37/00*     (2006.01)
    *D21G 1/02*     (2006.01)
    *B05C 11/10*     (2006.01)
    *B05D 3/02*     (2006.01)
    *F26B 11/02*     (2006.01)
    *F28F 5/06*     (2006.01)

(52) U.S. Cl.
    CPC ............... *F26B 11/02* (2013.01); *F28F 5/06* (2013.01); *H01M 2/1686* (2013.01); *H01M 10/0525* (2013.01)

(56) References Cited

U.S. PATENT DOCUMENTS

| | | | | |
|---|---|---|---|---|
| 3,842,596 A * | 10/1974 | Gray | ........ | F01D 5/088 165/104.25 |
| 4,183,298 A * | 1/1980 | Cappel | ........ | B41F 31/002 101/348 |
| 4,252,184 A * | 2/1981 | Appel | ........ | B31F 1/07 165/89 |
| 5,456,309 A * | 10/1995 | Vannucci, Jr. | ........ | F26B 13/183 165/90 |
| 5,671,549 A * | 9/1997 | Jimenez | ........ | B29C 33/044 34/125 |
| 5,899,264 A * | 5/1999 | Marschke | ........ | D21F 5/10 165/89 |
| 6,161,302 A * | 12/2000 | Rantala | ........ | D21F 5/022 165/89 |
| 6,250,376 B1 * | 6/2001 | Hendrix | ........ | D21F 5/028 165/89 |
| 8,070,468 B2 * | 12/2011 | Sano | ........ | B29B 13/023 165/89 |
| 2002/0029870 A1 * | 3/2002 | Schweinichen | ........ | D21G 1/0266 165/90 |
| 2004/0132596 A1 * | 7/2004 | Zaoralek | ........ | D21F 5/022 492/46 |
| 2007/0063376 A1 * | 3/2007 | Sano | ........ | B29C 43/24 264/173.1 |
| 2007/0138162 A1 * | 6/2007 | Tonomura | ........ | F28F 5/02 219/469 |
| 2009/0269656 A1 * | 10/2009 | Takita | ........ | B01D 67/0027 429/145 |
| 2009/0297649 A1 | 12/2009 | Sano et al. | | |

FOREIGN PATENT DOCUMENTS

| | | | | |
|---|---|---|---|---|
| JP | 2001-328163 | * | 11/2001 | ............ B29C 59/04 |
| JP | 2007-168222 A | | 7/2007 | |

* cited by examiner

HEATING ROLLER AND FILM
PRODUCTION METHOD

This Nonprovisional application claims priority raider 35 U.S.C. § 119 on Patent Application No. 2015-227976 filed in Japan on Nov. 20, 2015, the entire contents of which are hereby incorporated by reference.

TECHNICAL FIELD

The present invention relates to a heating roller including a cylindrical member for heating a film wrapped on an outer peripheral surface, with use of a heating medium that is supplied into the cylindrical member and ejected from inside the cylindrical member, and to a film production method.

BACKGROUND ART

There is a known heating roller in which a heating medium fluid is circulated inside a cylindrical member, so that a sheet-like heat-treatment target object in contact with an outer peripheral surface of the cylindrical member is heated to a predetermined temperature to dry (Patent Literature 1). The heating medium fluid is provided for the purpose of making the temperature of a surface of the cylindrical member uniform, which cylindrical member constitutes a main body of the heating roller. This heating medium fluid is caused to flow into the cylindrical member through a flow path, which is provided through a core cylinder located in a space formed inside the cylindrical member, and then to flow out of the cylindrical member after passing through another flow path between an inner peripheral wall of the cylindrical member and an outer peripheral wall of the core cylinder.

Further, there is another known heating roller for heating a web with use of heated water whose temperature is easily adjusted in a range of 90° C. to 100° C. by blowing vapor into the heated water standing inside a cylindrical member (Patent Literature 2). In the heating roller, the vapor is blown into the heated water standing inside the cylindrical member, through a vapor supply duct, a vapor distribution duct, and a plurality of vapor blowing ducts. The heated water increases in amount due to such blowing of vapor, and an amount of increased part of the heated water is caused to move through a drain hole and then ejected via an opening.

CITATION LIST

Patent Literature

[Patent Literature 1] Japanese Patent Application Publication, Tokukai, No. 2007-168222 (Publication Date: Jul. 5, 2007) (FIGS. 1 through 4, paragraph [0003] and [0004])
[Patent Literature 2] Japanese Utility Model Application Publication, Jitsuskokai, No. 59-50707 (Publication Date: Apr. 4, 1984) (FIGS. 1 and 2, pages 3 to 5 of the Specification)

SUMMARY OF INVENTION

Technical Problem

Patent Literature 1, however, has the following problem in configuration. That is, in the configuration, a core cylinder which forms a flow path is provided so as to reach one end surface side of the cylindrical member. Accordingly, the heating medium fluid discharged in a hot stale from the flow path formed by the core cylinder is supplied to the one end surface side of an inner peripheral wall of the cylindrical member. Consequently, the temperature of the inner peripheral wall excessively increases on the one end surface side, so that a peripheral wall of the cylindrical member has a thermal distribution that is not uniform in an axis direction of the cylindrical member. This disadvantageously makes it difficult to heat a film uniformly in a width direction of the film, which film is wrapped on the outer peripheral surface.

Meanwhile, Patent Literature 2 has the following problem in configuration. That is, in the configuration, the plurality of vapor blowing ducts is provided along an axis direction of the cylindrical member. Though the plurality of vapor blowing ducts makes a thermal distribution along the width direction of the cylindrical member more uniform, the heated water for drying the film wrapped on the peripheral surface of the cylindrical member is arranged to stand in only part of a space inside the cylindrical member. Accordingly, the cylindrical member tends to have a thermal distribution that is not uniform in a circumferential direction. This disadvantageously makes it difficult to heat a film uniformly in a transfer direction of the film, which film is wrapped on the outer peripheral surface of the cylindrical member and transferred.

The present invention is attained in view of the above problems. An object of the present invention is to provide a heating roller and a film production method, each of which is capable of heating a film, which is wrapped on an outer peripheral surface of a cylindrical member, nearly uniformly in a width direction of the film.

Another object of the present invention is to provide a heating roller and a film production method, each of which is capable of heating a film, which is wrapped on an outer peripheral surface of a cylindrical member, nearly uniformly in both a width direction and a transfer direction of the film.

Solution to Problem

In order to solve the above problems, a heating roller in accordance with an embodiment of the present invention includes: a cylindrical member for heating a film, with a heating medium which is supplied into the cylindrical member and ejected from inside the cylindrical member, the film being wrapped on an outer peripheral surface of the cylindrical member; and a discharge member for discharging, inside the cylindrical member, the heating medium toward one end surface of the cylindrical member, the heating medium being discharged at a position where a distance to the one end surface of the cylindrical member is longer than a distance to the other end surface of the cylindrical member.

In order to solve the above problems, a heating roller in accordance with an embodiment of the present invention includes: a cylindrical member for heating a film, with a heating medium which is supplied into the cylindrical member so as to fill the cylindrical member and ejected from inside the cylindrical member, the film being wrapped on an outer peripheral surface of the cylindrical member; and a discharge member for discharging, inside the cylindrical member, the heating medium toward an inner peripheral surface of the cylindrical member, the cylindrical member rotating on a center axis of the cylindrical member in response to transfer of the film, and the discharge member being fixed and not rotated on the center axis.

In order to solve the above problems, a heating roller in accordance with an embodiment of the present invention includes: a cylindrical member for heating a film, with a heating medium which is supplied into the cylindrical member and ejected from inside the cylindrical member, the film being wrapped on an outer peripheral surface of the cylindrical member; and a discharge member for discharging, toward one end surface of the cylindrical member, the heating medium which is supplied into the cylindrical member, the discharge member separating the heating medium into portions and discharging the portions of the heating medium respectively at a first discharge position and a second discharge position, the first discharge position and the second discharge position being arranged such that a distance from the second discharge position to the one end surface is longer than a distance from the first discharge position to the one end surface.

In order to solve the above problems, a heating roller in accordance with an embodiment of the present invention includes: a cylindrical member for heating a film, with a heating medium which is supplied into the cylindrical member and ejected from inside the cylindrical member, the film being wrapped on an outer peripheral surface of the cylindrical member; and a discharge member for discharging, inside the cylindrical member, the heating medium toward one end surface of the cylindrical member, the cylindrical member having a peripheral wall which is thicker on a side (one end surface side) corresponding to the one end surface of the cylindrical member than on another side (the other end surface side) corresponding to the other end surface of the cylindrical member.

In order to solve the above problems, a film production method in accordance with an embodiment of the present invention includes the steps of: supplying a heating medium into a heating roller in accordance with an embodiment of the present invention and ejecting the heating medium from inside the heating roller; and heating a film by wrapping the film on an outer peripheral surface of a cylindrical member of the heating roller.

Advantageous Effects of Invention

The present invention advantageously makes it possible to provide a heating roller and a film production method, each of which is capable of heating a film, which is wrapped on an outer peripheral surface of a cylindrical member, nearly uniformly in a width direction of the film.

The present invention also advantageously makes it possible to provide a heating roller and a film production method, each of which is capable of heating a film, which is wrapped on an outer peripheral surface of a cylindrical member, nearly uniformly in both a width direction and a transfer direction of the film.

DESCRIPTION OF EMBODIMENTS

The following description will discuss in detail embodiments of the present invention.

Embodiment 1

The following description will discuss, in order, a lithium-ion secondary battery, a separator for batteries, and a heat-resistant separator in accordance with Embodiment 1.

<Lithium-Ion Secondary Battery>

A nonaqueous electrolyte secondary battery, typically, a lithium-ion secondary battery has a high energy density, and therefore, currently widely used not only as batteries for use in devices such as personal computers, mobile phones, and mobile information terminals, and for use in moving bodies such as automobiles and airplanes, but also as stationary batteries contributing to stable power supply.

Figure 1:
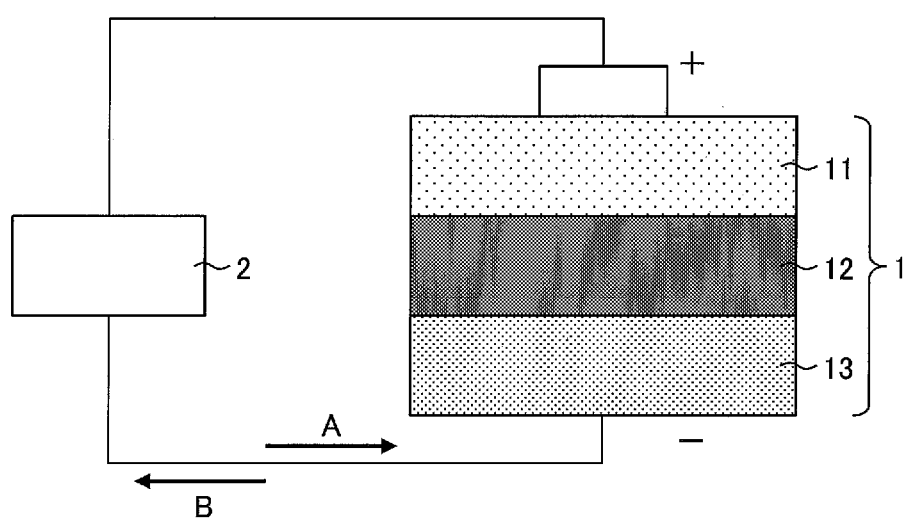
FIG. 1 is a schematic view illustrating a cross sectional configuration of a lithium-ion secondary battery in accordance with Embodiment 1.

FIG. 1 is a schematic view illustrating a cross sectional configuration of a lithium-ion secondary battery 1. As illustrated in FIG. 1, the lithium-ion secondary battery 1 includes a cathode 11, a separator 12, and an anode 13. Between the cathode 11 and the anode 13, an external device 2 is connected outside the lithium-ion secondary battery 1. Then, while the lithium-ion secondary battery 1 is being charged, electrons move in a direction A. On the other hand, while the lithium-ion secondary battery 1 is being discharged, electrons move in a direction B.

<Separator>

The separator 12 is provided so as to be sandwiched between the cathode 11 as a positive electrode of the lithium-ion secondary battery 1 and the anode 13 as a negative electrode of the lithium-ion secondary battery 1. The separator 12 is a porous film which separates the cathode 11 and the anode 13, allowing lithium ions to move between the cathode 11 and the anode 13. The separator 12 contains, for example, polyolefin such as polyethylene or polypropylene as a material.

Figure 2:
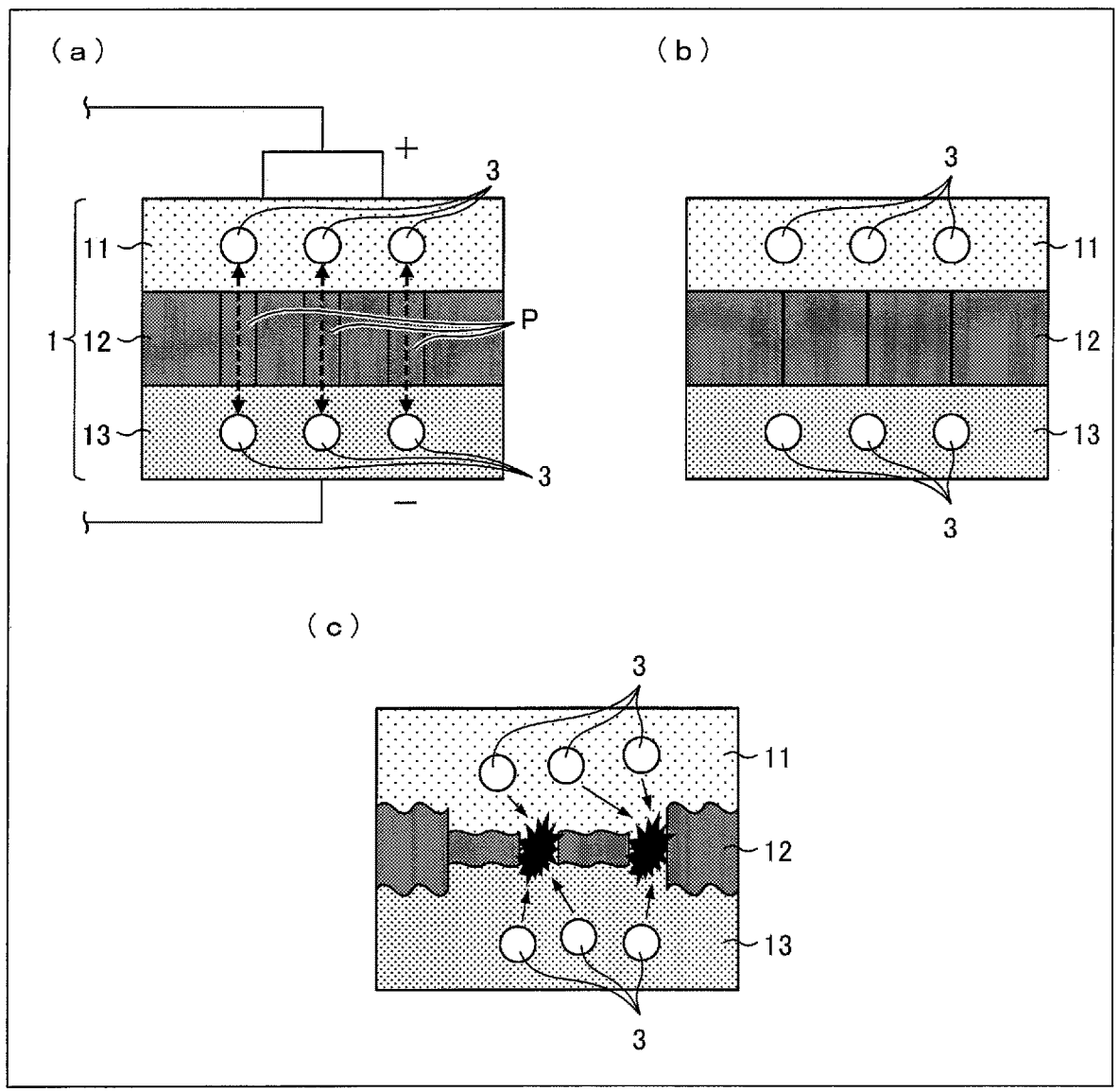
FIG. 2 is a schematic view illustrating details of the configuration of the lithium-ion secondary battery illustrated in FIG. 1.

FIG. 2 is a schematic view illustrating details of the configuration of the lithium-ion secondary battery 1 illustrated in FIG. 1. (a) of FIG. 2 illustrates a normal configuration. (b) of FIG. 2 illustrates a state in which a temperature of the lithium-ion secondary battery 1 has risen (c) of FIG. 2 illustrates a state in which a temperature of the lithium-ion secondary battery 1 has sharply risen.

As illustrated in (a) of FIG. 2, the separator 12 is provided with many pores P. Normally, lithium ions 3 in the lithium-ion secondary battery 1 can move back and forth through the pores P.

However, there are, for example, cases in which the temperature of the lithium-ion secondary battery 1 rises due to excessive charging of the lithium-ion secondary battery 1, a high current caused by short-circuiting of the external device, or the like. In such cases, the separator 12 melts or softens, and the pores P are blocked as illustrated in (b) of FIG. 2. As a result, the separator 12 shrinks. This stops the above back-and-forth movement of the lithium ions 3, and consequently stops the above temperature rise.

However, in a case where a temperature of the lithium-ion secondary battery 1 sharply rises, the separator 12 suddenly shrinks. In this case, as illustrated in (c) of FIG. 2, the separator 12 may be broken. Then, the lithium ions 3 leak out from the separator 12 which has been broken. As a result, the lithium ions 3 do not stop moving back and forth. Consequently, the temperature continues rising.

<Heat-Resistant Separator>

Figure 3:
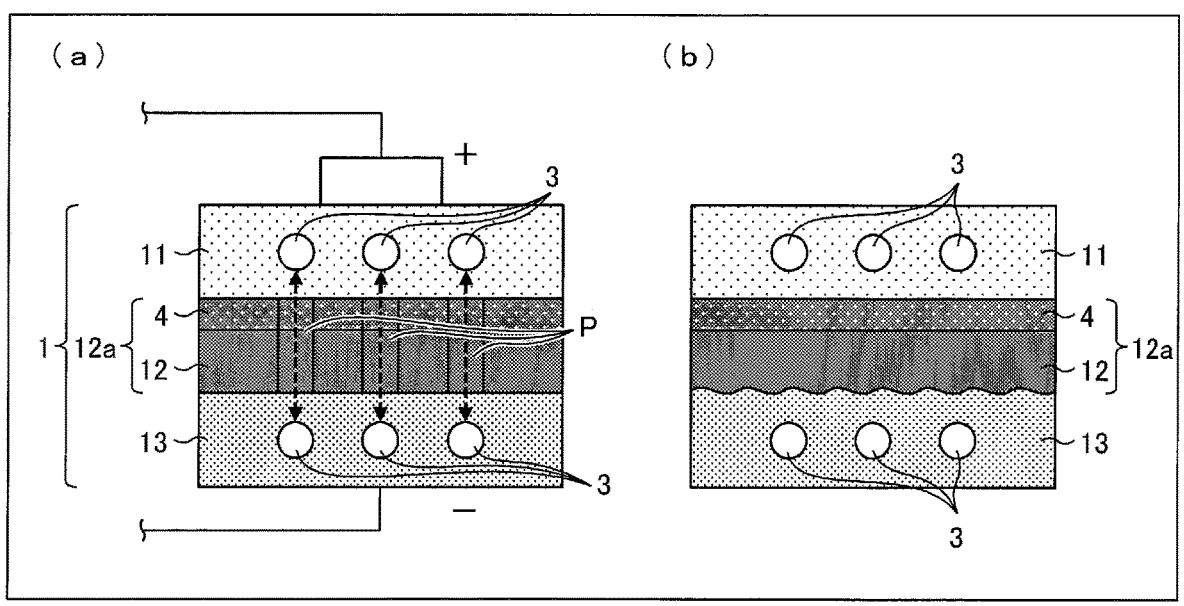
FIG. 3 is a schematic view illustrating another configuration of the lithium-ion secondary battery illustrated in FIG. 1.

FIG. 3 is a schematic view illustrating another configuration of the lithium-ion secondary battery 1 illustrated in FIG. 1. (a) of FIG. 3 illustrates a normal configuration, and (b) of FIG. 3 illustrates a state in which a temperature of the lithium-ion secondary battery 1 has sharply risen.

As illustrated in (a) of FIG. 3, the lithium-ion secondary battery 1 can further include a heat-resistant layer 4. The heat-resistant layer 4 and the separator 12 form a heat-resistant separator 12a (separator). The heat-resistant layer 4 is laminated on one surface of the separator 12 which surface is on a cathode 11 side. Note that the heat-resistant layer 4 can be alternatively laminated on the other surface of the separator 12 which surface is on an anode 13 side, or on both surfaces of the separator 12. Further, the heat-resistant layer 4 is provided with pores which are similar to the pores P. Normally, the lithium ions 3 move back and forth through the pores P and the pores of the heat-resistant layer 4. The heat-resistant layer 4 contains, for example, wholly aromatic polyamide (aramid resin) as a material.

As illustrated in (b) of FIG. 3, even in a case where the temperature of the lithium-ion secondary battery 1. sharply rises and accordingly the separator 12 melts or softens, the shape of the separator 12 is maintained because the heat-resistant layer 4 supports the separator 12. Therefore, such a sharp temperature rise results in only melting or softening of the separator 12 and consequent blocking of the pores P. This stops back-and-forth movement of the lithium ions 3 and consequently stops the above-described excessive discharging or excessive charging. In this way, the separator 12 can be prevented from being broken.

<Production Steps of Heat-Resistant Separator Original Sheet (Separator Original Sheet)>

How to produce the heat-resistant separator 12a of the lithium-ion secondary battery 1 is not specifically limited. The heat-resistant separator 12a can be produced by a publicly-known method. The following discussion assumes a case where the separator 12 contains polyethylene as a main material. However, even in a case where the separator 12 contains another material, the similar steps can still be applied to production of the heat-resistant separator 12a.

For example, it is possible to employ a method including the steps of first forming a film by adding an inorganic filler or a plasticizer to a thermoplastic resin, and then removing the organic filler or the plasticizer with an appropriate solvent. For example, in a case where the separator 12 is a polyolefin separator made of a polyethylene resin containing ultra-high molecular weight polyethylene, it is possible to produce the separator 12 by the following method.

This method includes (1) a kneading step of obtaining a polyethylene resin composition by kneading a ultra-high molecular weight polyethylene with an inorganic filler (e.g., calcium carbonate, or silica) or plasticizer (e.g., low molecular weight polyolefin, or liquid paraffin), (2) a rolling step of forming a film with the polyethylene resin composition, (3) a removal step of removing the inorganic filler or the plasticizer from the film obtained in the step (2), and (4) a stretching step of obtaining the separator 12 by stretching the film obtained in the step (3). Note that the step (4) can be carried out between the steps (2) and (3).

In the removal step, many fine pores are provided in the film. The fine pores of the film stretched in the stretching step become the above-described pores P. The separator 12 thus formed is a polyethylene microporous film having a prescribed thickness and a prescribed air permeability.

Note that, in the kneading step, 100 parts by weight of the ultra-high molecular weight polyethylene, 5 parts by weight to 200 parts by weight of a low molecular weight polyolefin having a weight-average molecular weight of 10000 or less, and 100 parts by weight to 400 parts by weight of the inorganic filler can be kneaded.

Thereafter, in a coating step, the heat-resistant 1 layer 4 is formed on a surface of the separator 12. For example, on the separator 12, an aramid/NMP (N-methylpyrrolidone) solution (coating solution) is applied, and thereby, the heat-resistant layer 4 that is an aramid heat-resistant layer is formed. The heat-resistant layer 4 can be provided on only one surface or both surfaces of the separator 12. Alternatively, the heat-resistant layer 4 can be formed by using, for coating, a mixed solution containing a filler such as alumina/carboxy methyl cellulose.

In the coating step, it is also possible to form an adhesive layer on a surface of the separator 12, by first applying, to the surface of the separator 12, a polyvinylene fluoride/dimethyacetamide solution (coating solution) (application sub-step) and then solidifying the solution (solidification sub-step). Such an adhesive layer can be formed on only one surface or both surfaces of the separator 12.

A method of coating the separator 12 with a coating solution is not specifically limited as long as uniform wet coating can be performed by the method. The method can be a conventionally publicly-known method such as a capillary coating method, a slit die coating method, a spray coating method, a dip coating method, a roll coating method, a screen printing method, a flexo printing method, a bar coater method, a gravure coater method, or a die coater method. The heat-resistant layer 4 has a thickness which can be controlled toy adjusting a thickness of a coating wet film, a solid-content concentration represented by the sum of a binder concentration and a filler concentration in the coating solution, or a ratio of a filler to a binder in the coating solution.

It is possible to use a resin film, a metal belt, a drum or the like as a support with which the separator 12 is fixed or transferred in coating.

<Configuration of Heat-Resistant Separator Original Sheet>

Figure 4:
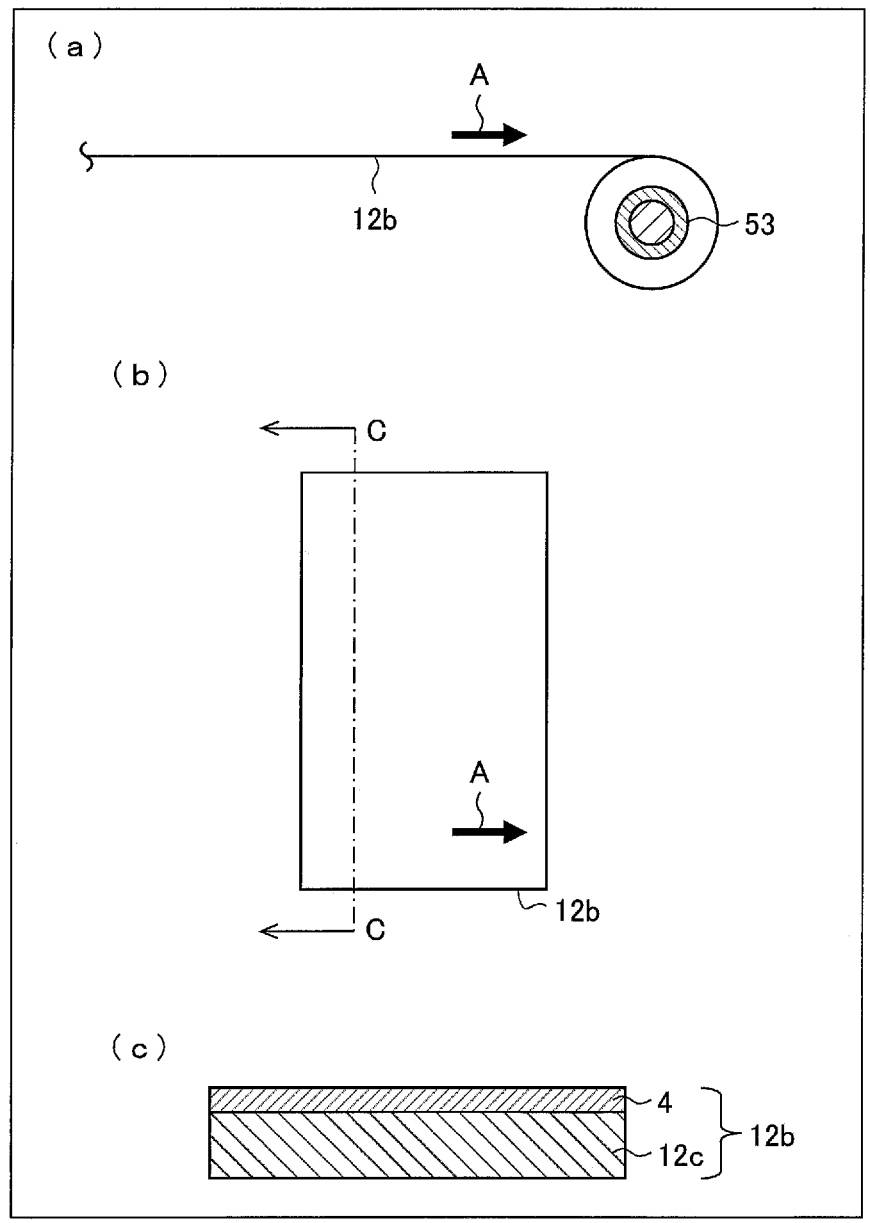
FIG. 4 is a view illustrating a heat-resistant separator original sheet, which is a separator original sheet having the above another configuration in which a heat-resistant layer is laminated.

FIG. 4 is a view illustrating an original sheet 12b (film) of a heat-resistant separator (hereinafter, referred to as a "heat-resistant separator original sheet 12b") in which the heat-resistant layer 4 is laminated on an original sheet 12c of a separator (hereinafter, referred to as a "separator original sheet 12c"). (a) of FIG. 4 illustrates a state in which the heat-resistant separator original sheet 12b is being wound; (b) of FIG. 4 is a plan view illustrating the heat-resistant separator original sheet 12b; and (c) of FIG. 4 is a cross sectional view taken along a plane CC in (b) of FIG. 4.

It is possible to produce a heat-resistant separator original sheet 12b (hereinafter, simply referred to as "separator original sheet 12b") which is a separator original sheet in which the heat-resistant layer 4 is laminated on the separator original sheet 12c in accordance with the above-described production method. The separator original sheet 12b thus produced is transferred in a direction indicated by an arrow A and wound around a core 53 having a cylindrical shape (see (a) and (b) of FIG. 4). Note that an object to be produced by the above production method is not limited to the separator original sheet 12b. The above production method does not necessarily include the coating step. In a case where the method includes no coating step, the object to be produced is a separator original sheet 12c in which no heat-resistant layer 4 is laminated. Though the following discusses, as an example, the separator original sheet 12b (film) including, as a main functional layer, the heat-resistant layer 4, a similar process (steps) can be applied to a separator (film) having no functional layer and to a separator original sheet (original sheet of a film (hereinafter, referred to as a "film original sheet").

<Configuration of Drying Device 21>

Figure 5:
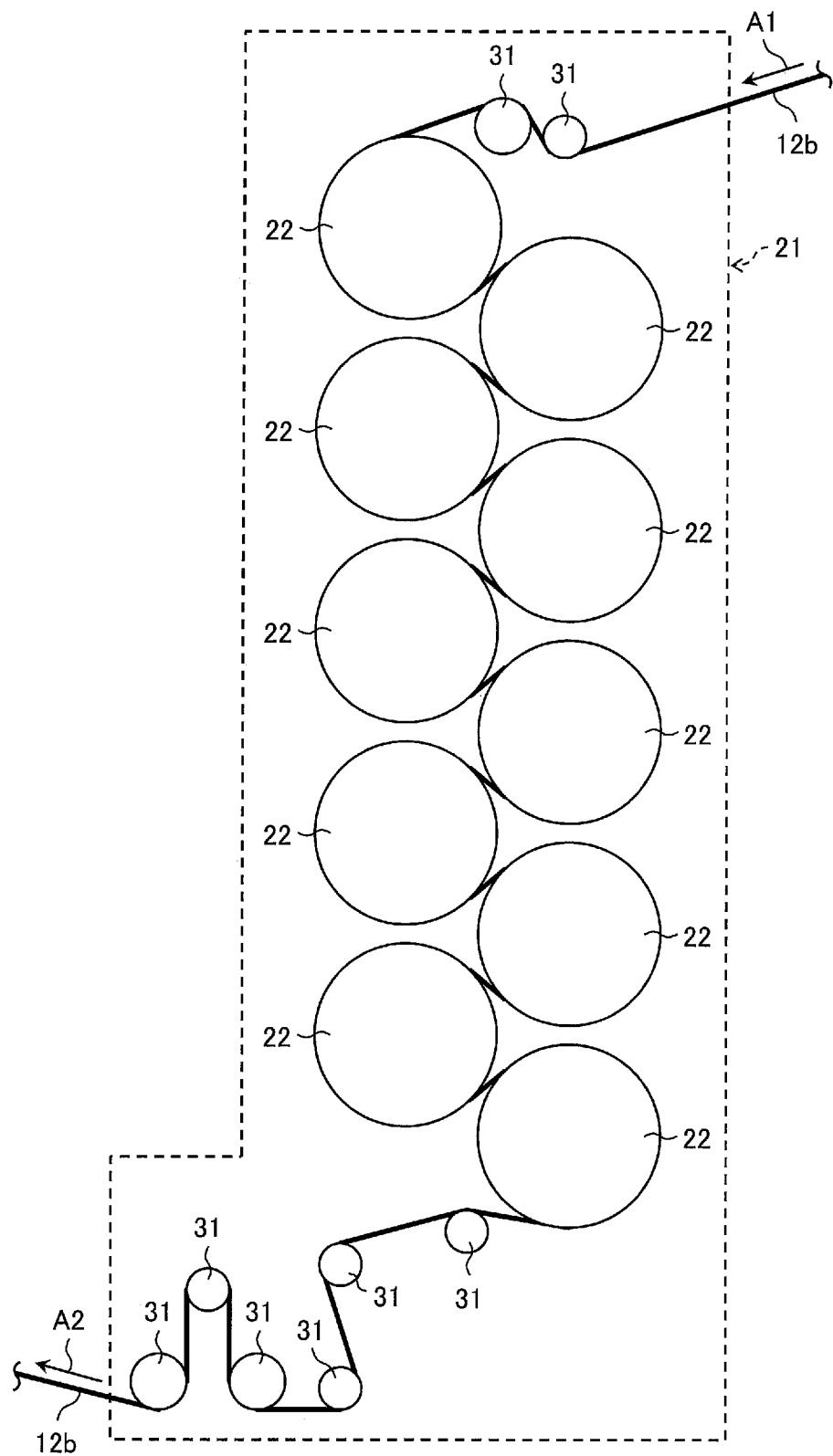
FIG. 5 is a schematic view illustrating a drying device for drying the heat-resistant separator original sheet.

FIG. 5 is a schematic view illustrating a configuration of a drying device 21 for drying the separator original sheet 12b. The drying device 21 dries the separator original sheet 12b in which the separator original sheet 12c is coated with the heat-resistant layer 4. The separator original sheet 12b is fed into the drying device 21, in a direction indicated by an arrow A1. The separator original sheet 12b is transferred by two transfer rollers 31. Then, the separator original sheet 12b is further transferred by ten drying rollers 22 (heating rollers), while being wrapped sequentially on the drying rollers 22. These ten drying rollers 22 are provided close together and alternately in two rows (i.e., left and right rows). Subsequently, the separator original sheet 12b is further transferred by six other transfer rollers 31, and ejected in a direction indicated by an arrow A2 from the drying device 21.

<Configuration of Drying Roller 22>

Figure 6:
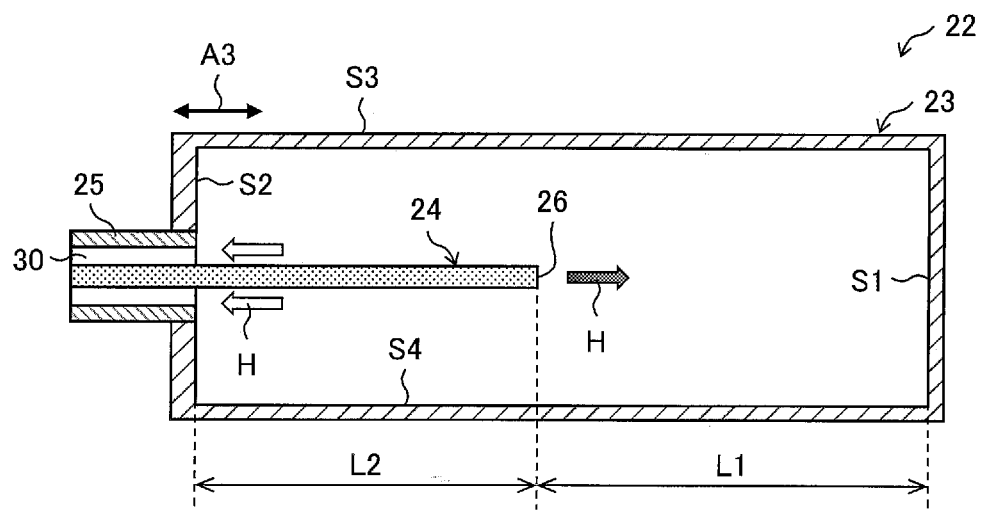
FIG. 6 is a schematic cross sectional view illustrating a configuration of a drying roller provided in the drying device.

FIG. 6 is a schematic cross sectional view illustrating a configuration of a drying roller 22 provided in the drying device 21. The drying roller 22 includes a cylindrical member 23. Further, the cylindrical member 23 has an outer peripheral surface S3, an inner peripheral surface S4, and inner end surfaces S1 and S2. The drying roller 22 is provided with a cylindrical outlet member 25 on the inner end surface S2 side. The separator original sheet 12b is wrapped on the outer peripheral surface S3 and transferred.

The drying roller 22 is provided with a cylindrical discharge pipe 24 (discharge member) which is inserted into the cylindrical member 23 through the outlet member 25. The drying roller 22 is provided with an outlet 30 which is formed between an inner peripheral surface of the outlet member 25 and an outer peripheral surface of the discharge pipe 24.

The discharge pipe 24 has a discharge opening 26 at a tip of the discharge pipe 24. A distance L1 from the discharge opening 26 to the inner end surface S1 is equal to or longer than a distance L2 from the discharge opening 26 to the inner end surface S2. The inside of the cylindrical member 23 is filled with hot water H.

<Operation of Drying Roller 22>

The discharge pipe 24 discharges the hot water H through the discharge opening 26 toward the inner end surface S1. The hot water H inside the cylindrical member 23 increases in amount by discharge of the hot water H through the discharge opening 26, and an amount of increased part of the hot water H is ejected through the outlet 30 from the drying roller 22.

Since the distance L1 from the discharge opening 26 to the inner end surface S1 is arranged to be equal to or longer than the distance L2 from the discharge opening 26 to the inner end surface S2, the hot water H moves for a longer distance from the discharge opening 26 to an inner end surface S1 side. Accordingly, the hot water H discharged in a hot state decreases in temperature before reaching the inner end surface S1 side. Accordingly, such increase in temperature is suppressed on the inner end surface S1 side. This allows the cylindrical member 23 of the drying roller 22 to have a nearly uniform thermal distribution along a width direction A3 of the outer peripheral surface S3. Consequently, it is possible to dry the separator original sheet 12 nearly uniformly in the width direction A3, which separator original sheet 12 is wrapped on the outer peripheral surface S3 of the cylindrical member 2.

The hot water H is discharged preferably at a temperature in a range of 65° C. to 100° C., through the discharge opening 26 of the discharge pipe 24.

The discharge pipe 24 has a linear tubular shape whose diameter is smaller than that of the outlet 30. This makes assembly work for inserting the discharge pipe 24 into the cylindrical member 23 through the outlet 30 uncomplicated and simple.

Though in Embodiment 1, the above has described an example in which the hot water H is discharged from the discharge pipe 24, the present is not limited to this example. The discharge pipe 24 only need to discharge a heating medium for drying the separator original sheet 12b wrapped on the outer peripheral surface S3 of the cylindrical member 23. The heating medium can alternatively be, for example, heated oil or vapor.

Though in Embodiment 1, the above has described an example in which the separator original sheet 12b is dried, the present invention is not limited to this example. The present invention can be applied to a drying roller for drying, other than a separator original sheet, a web of belt-like film, paper, cloth, or, a complex or processed material thereof, or the like. The same applies to Embodiments 2 to 4 described below.

In addition, though in Embodiment 1, the above has described an example in which the heating roller in accordance with an embodiment of the present invention is applied to the drying roller 22 for drying the separator original sheet 12b, the present invention is not limited to this example. The present invention can be suitably applied to various processes in which a film is heated, for example, processes of reforming, unwrinkling, annealing, and the like of a film, other than drying of a film.

Embodiment 2

Figure 7:
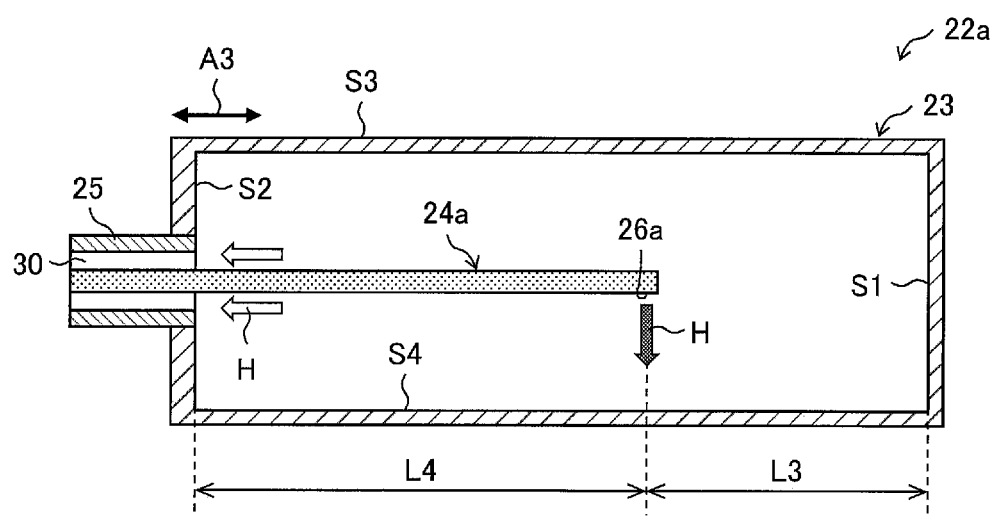
FIG. 7 is a schematic cross sectional view illustrating a configuration of a drying roller in accordance with Embodiment 2.

FIG. 7 is a schematic cross sectional view illustrating a configuration of a drying roller 22a in accordance with Embodiment 2. A constituent element identical to that described above is given an identical reference sign and a detailed description thereof will not be repeated.

The drying roller 22a includes a cylindrical member 23 and a discharge pipe 24a. The discharge pipe 24a discharges hot water H toward an inner peripheral surface S4 of a cylindrical member 23 through a discharge opening 26a which is formed on an outer peripheral surface of the discharge pipe 24a.

Such discharge of the hot water H toward the inner peripheral surface S4 of the cylindrical member 23 allows an outer peripheral surface S3 of the cylindrical member 23 to have a nearly uniform thermal distribution along an axis direction of the cylindrical member 23. At the same time, since the hot water H fills the inside of the cylindrical member 23, the outer peripheral surface S3 of the cylindrical member 23 also has a nearly uniform thermal distribution along a circumferential direction of the cylindrical member 23. This consequently makes it possible to dry the separator original sheet 12b wrapped on the outer peripheral surface S3 of the cylindrical member 23, nearly uniformly in a width direction A3 of the outer peripheral surface S3 and in a transfer direction of the separator original sheet 12b.

Further, since the heating medium discharged through the discharge opening 26a is the hot water H, the configuration of the drying roller 22a is less complicated and simpler as compared to Patent Literature 2 which manages both hot water and vapor.

The discharge pipe 24a has a linear tubular shape whose diameter is smaller than that of the outlet 30. This makes assembly work for inserting the discharge pipe 24a into the cylindrical member 23 through the outlet 30 uncomplicated and simple.

A distance L4 from the discharge opening 26a to the inner end surface S2 is preferably longer than a distance L3 from the discharge opening 26a to the inner end surface S1. This is because, in a case where the distance L3 is equal to or longer than the distance L4, a flow of the hot water H toward an outlet 30 side via a shortcut will be dominant when the hot water H is discharged through the discharge opening 26a.

Figure 8:
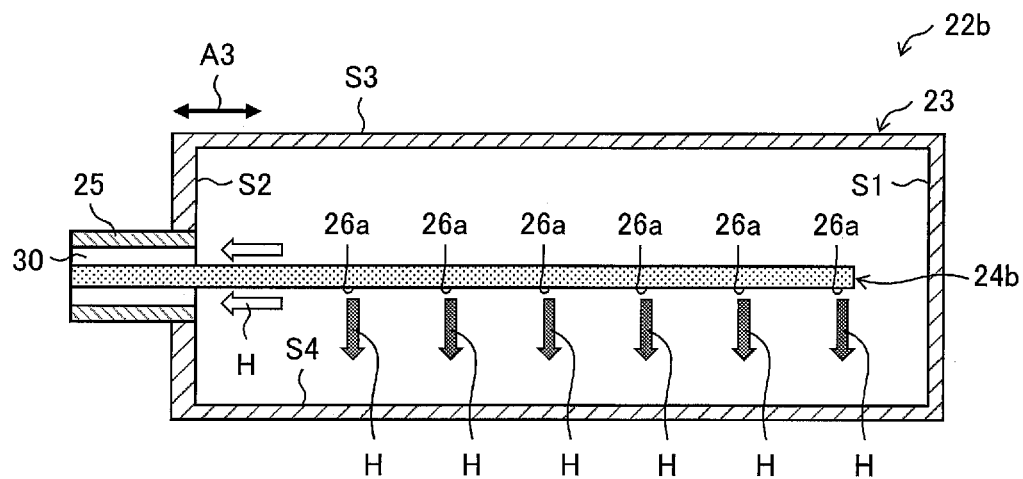
FIG. 8 is a schematic cross sectional view illustrating another configuration of a drying roller in accordance with Embodiment 2.

FIG. 8 is a schematic cross sectional view illustrating another configuration of a drying roller 22b in accordance with Embodiment 2. A constituent element identical to that described above is given an identical reference sign and a detailed description thereof will not be repeated.

The drying roller 22b includes a cylindrical member 23 and a discharge pipe 24b. The discharge pipe 24b is provided with a plurality of discharge openings 26a along an axis direction of the cylindrical member 23, and hot water H is discharged through each of the plurality of discharge openings 26a toward the inner peripheral surface S4 of the cylindrical member 23. The plurality of discharge openings 26a can be aligned in one line or alternatively can be arranged in a plurality of rows. Further, the plurality of discharge openings 26a can be provided at equal intervals or at unequal intervals. Furthermore, the plurality of discharge openings 26a can be arranged in a line along an axis direction of the discharge pipe 24b or alternatively arranged in a helical manner along the axis direction.

Since the drying roller 22b has the plurality of discharge openings 26a for discharging the hot water toward the inner peripheral surface S4 of the cylindrical member 23 along the axis direction of the cylindrical, member 23, the outer peripheral surface S3 of the cylindrical member 23 can have a thermal distribution arranged to be more strictly uniform in the width direction A3.

The discharge pipe 24b has a linear tubular shape whose diameter is smaller than that of the outlet 30. This makes assembly work for inserting the discharge pipe 24b into the cylindrical member 23 through the outlet 30 uncomplicated and simple.

Embodiment 3

Figure 9:
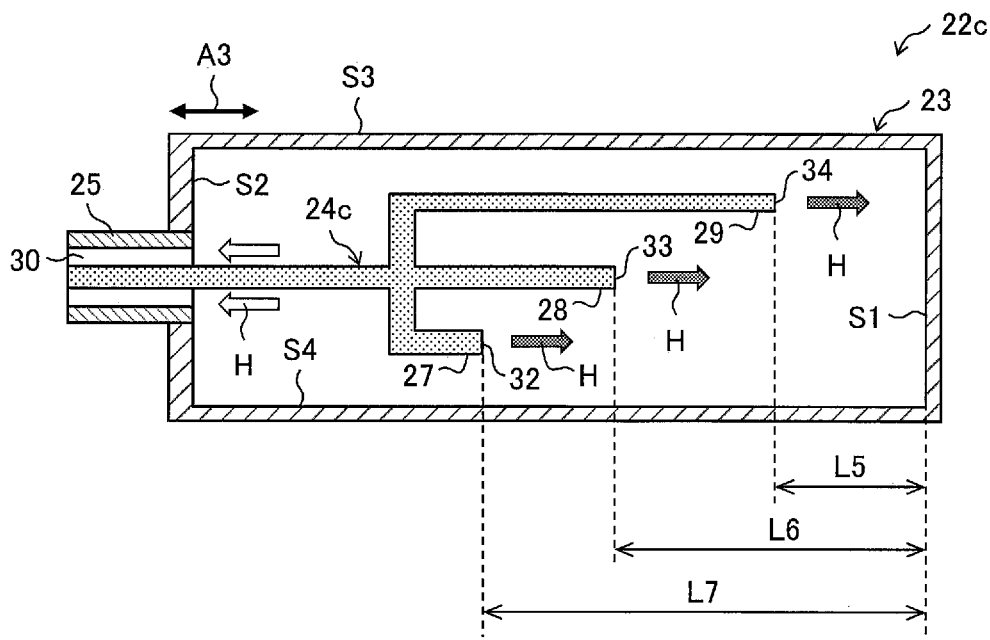
FIG. 9 is a schematic cross sectional view illustrating a configuration of a drying roller in accordance with Embodiment 3.

FIG. 9 is a schematic cross sectional view illustrating a configuration of a drying roller 22c in accordance with Embodiment 3. A constituent element identical to that described above is given an identical reference sign and a detailed description thereof will not be repeated.

The drying roller 22c includes a cylindrical member 23 and a discharge pipe 24c. The discharge pipe 24c includes a discharge branch 28 extending along a center axis of the cylindrical member 23, and discharge branches 27 and 29 which branch from the discharge branch 28. The discharge branch 28 has a discharge opening 33 (second discharge opening) at a tip of the discharge branch 28, while the discharge branch 29 has a discharge opening 34 (first discharge opening) at a tip of the discharge branch 29. Further, the discharge branch 27 has a discharge opening 32 (first discharge opening) at a tip of the discharge branch 27. A distance L6 from the discharge opening 33 to an inner end surface S1 is arranged to be longer than a distance L5 from the discharge opening 34 to the inner end surface S1. Meanwhile, a distance L7 from the discharge opening 32 to the inner end surface S1 is arranged to be longer than a distance L6 from the discharge opening 33 to the inner end surface S1.

In this way, the discharge openings 32, 33, and 34 differ from one another in position in a direction orthogonal to an axis direction of the cylindrical member 23, so that the distances from the discharge openings 32, 33, and 34 to the inner end surface S1 of the cylindrical member 23 differ from one another.

In the drying roller 22c configured as described above, hot water H is supplied into the cylindrical member 23 via the discharge pipe 24c, and part of the hot water H moving toward the discharge opening 34 of the discharge pipe 29 is separated and discharged through the discharge opening 33 of the discharge branch 28. Accordingly, the hot water H discharged through the discharge opening 34 decreases in amount by an amount of the hot water H that is separated to move toward the discharge opening 33. Further, other part of the hot water H supplied into the cylindrical member 23 via the discharge pipe 24c and moving toward the discharge opening 34 is separated and discharged through the discharge opening 32 of the discharge branch 27. Therefore, the hot water H discharged through the discharge opening 34 further decreases in amount by an amount of the hot water M that is separated to move toward the discharge opening 32.

Accordingly, it is possible to suppress a rise in temperature on an inner end surface S1 side of an outer peripheral surface S3, which rise in temperature may occur due to the hot water H discharged through the discharge opening 34 toward an inner peripheral surface S1 of the cylindrical member 23. Consequently, this makes it possible to have a nearly uniform thermal distribution along a width direction A3 of an outer peripheral surface S3 of the cylindrical member 33 in the drying roller 22c. As a result, it is possible to dry, nearly uniformly in the width direction A3, a separator original sheet 12b wrapped on the outer peripheral surface S3 of the cylindrical member 23.

Embodiment 4

Figure 10:
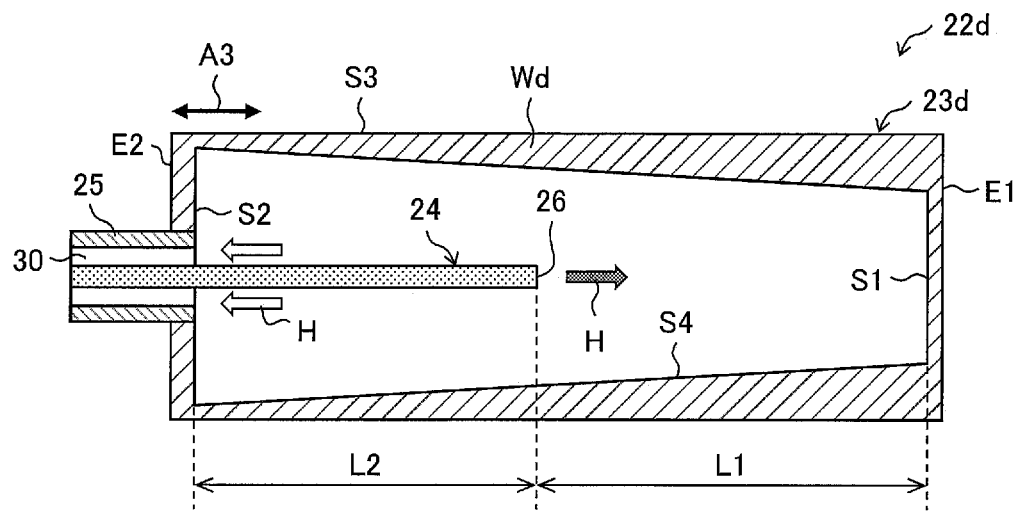
FIG. 10 is a schematic cross sectional view illustrating a configuration of a drying roller in accordance with Embodiment 4.

FIG. 10 is a schematic cross sectional view illustrating a configuration of a drying roller 22d in accordance with Embodiment 4. Each constituent element identical to that described above with reference to FIG. 6 is given an identical reference sign, and accordingly, a detailed description thereof will not be repeated.

The drying roller 22d is different from the drying roller 22 described above with reference to FIG. 6, in that the drying roller 22d includes a cylindrical member 23d which has an inclined wall thickness. The cylindrical member 23d has a peripheral wall Wd which is thicker on one end E1 side than on the other end E2 side. In a case where the peripheral wall Wd of the cylindrical member 23d is arranged to be thicker on the one end E1 side than on the other end E2 side, the peripheral wall Wd has a larger thermal resistance on the one end E1 side than the other end E2 side.

Meanwhile, hot water H discharged through a discharge opening 26 toward an inner end surface S1 flows from the one end E1 of an inner peripheral surface S4 side toward the other end E2 side of the inner peripheral surface S4, while being in contact with the peripheral wall Wd and cooled. Accordingly, the temperature of the hot water H in convention on the one end E1 side of the inner peripheral surface S4 is higher than the temperature of the hot water H in convection on the other end E2 side of the inner peripheral surface S4. Since the peripheral wall Wd has a larger thermal resistance on the one end E1 side than the other end E2 side, a temperature distribution along a width direction on an outer peripheral surface S3 of the cylindrical member 23d is more uniform than that on the outer peripheral surface S3 of the cylindrical member 23, which is illustrated in FIG. 6 and has a wall thickness that is not inclined.

Figure 11:
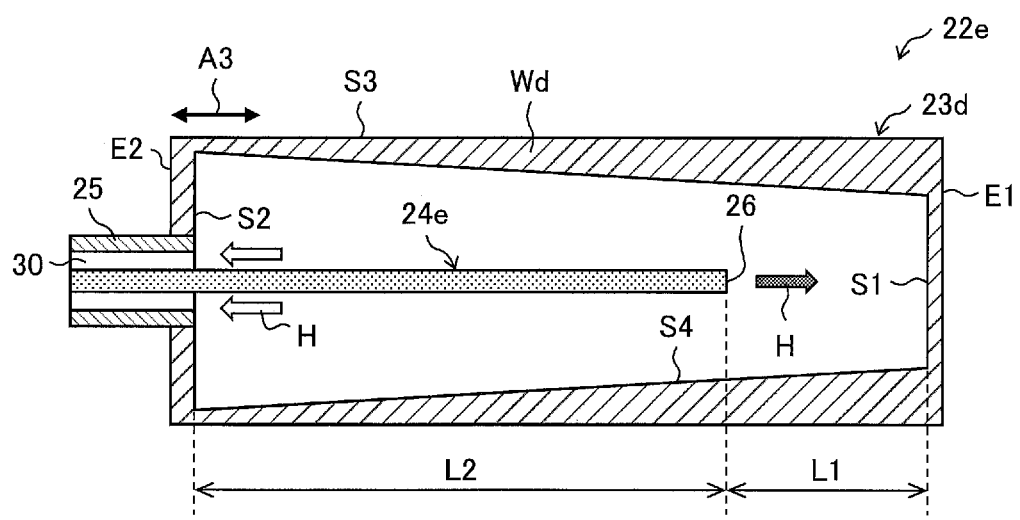
FIG. 11 is a schematic cross sectional view illustrating another configuration of a drying roller in accordance with Embodiment 4.

FIG. 11 is a schematic cross sectional view illustrating a configuration of another drying roller 22e in accordance with Embodiment 4. Each constituent element identical to that described above with reference to FIGS. 6 and 10 is given an identical reference sign, and accordingly, a detailed description thereof will not be repeated.

The drying roller 22e is different from the drying roller 22 and the drying roller 22d which are described above with reference to FIGS. 6 and 10, respectively, in that the drying roller 22e has a discharge pipe 24e whose discharge opening 26 is located closer to an inner end surface S1 than to an inner end surface S2. In other words, a distance L1 from the discharge opening 26 to the inner end surface S1 is shorter than a distance L2 from the discharge opening 26 to the inner end surface S2. In a case where the drying roller 22e is arranged to have a cylindrical member 23d having an peripheral wall Wd whose thickness is inclined, the cylindrical member 23d can have a nearly uniform temperature distribution along a width direction A3 on an outer peripheral surface S3 of the cylindrical member 23d even in the above configuration in which the discharge opening 26 of the discharge pipe 24e is arranged to be closer to the inner end surface S1 than to the inner end surface S2.

Further, in a case where a distance from the discharge opening 26 to the inner end surface S2 is longer than a distance from the discharge opening 26 to the inner end surface S1, hot water H discharged through the discharge opening 26 is prevented from moving to an outlet 30 side via a shortcut, not reaching the inner peripheral surface S4.

(Main Points)

In order to solve the above problems, a heating roller in accordance with an embodiment of the present invention includes: a cylindrical member for heating a film, with a heating medium which is supplied into the cylindrical member and ejected from inside the cylindrical member, the film being wrapped on an outer peripheral surface of the cylindrical member; and a discharge member for discharging, inside the cylindrical member, the heating medium toward one end surface of the cylindrical member, the heating medium being discharged at a position where a distance to the one end surface of the cylindrical member is longer than a distance to the other end surface of the cylindrical member.

With this feature, the heating medium moves for a longer distance from a position at which the heating medium is discharged toward the one end surface of the cylindrical member, to a position which is on a side corresponding to the one end surface of the cylindrical member and on an inner peripheral surface of the cylindrical surface. Accordingly, the heating medium discharged in a hot state can decrease in temperature before the heating medium reaches the position on the inner peripheral surface on the side corresponding to the one end surface of the cylindrical member. This makes it possible to suppress a rise in temper attire of the outer peripheral surface on the side corresponding to the one end surface. Consequently, the cylindrical member of the drying roller can have a nearly uniform thermal distribution along a width direction of the outer peripheral surface. As a result, it is possible to heat a film, which is wrapped on the outer peripheral surface of the cylindrical member, nearly uniformly in the width direction.

The heating roller in accordance with an embodiment of the present invention is preferably arranged such that: the cylindrical member is provided with an outlet for ejecting the heating medium, the outlet being formed at the other end surface of the cylindrical member; and the discharge member has a cylindrical shape, and is inserted into the cylindrical member through the outlet.

The above configuration allows a configuration for assembling the discharge member into the cylindrical member by inserting the discharge member into the cylindrical member through the outlet, to be an uncomplicated and simple configuration.

In order to solve the above problems, a heating roller in accordance with an embodiment of the present invention includes: a cylindrical member for heating a film, with a heating medium which is supplied into the cylindrical member so as to fill the cylindrical member and ejected from inside the cylindrical member, the film being wrapped on an outer peripheral surface of the cylindrical member; and a discharge member for discharging, inside the cylindrical member, the heating medium toward an inner peripheral surface of the cylindrical member, the cylindrical member rotating on a center axis of the cylindrical member in response to transfer of the film, and the discharge member being fixed and not rotated on the center axis.

With the above feature, the heating medium discharged from the discharge member toward the inner peripheral surface of the cylindrical member moves and reaches the inner peripheral surface, by taking a route which, when viewed along a cross section perpendicular to the center axis of the cylindrical member, is curved in a direction along the inner peripheral surface of the cylindrical member that rotates in response to transfer of the film. This increases a transfer distance of the heating medium from a position at which the heating medium is discharged to the inner peripheral surface. This consequently decreases the temperature of the heating medium discharged in a hot state, before the heating medium reaches the inner peripheral surface of the cylindrical member. Accordingly, it is possible to suppress a rise in temperature of the outer peripheral surface corresponding to the position where the heating medium is discharged, and consequently to allow the cylindrical member of the drying roller to have a nearly uniform thermal distribution along the width direction of the outer peripheral surface. As a result, it is possible to heat the film, which is wrapped on the outer peripheral surface of the cylindrical member, nearly uniformly in the width direction.

The heating roller in accordance with an embodiment of the present invention is preferably arranged such that: the heating medium is heated liquid.

Since the heating medium is heated liquid, the above configuration is less complicated and simpler as compared to that of Patent Literature 2 which manages both hot water and vapor.

The heating roller in accordance with an embodiment of the present invention is preferably arranged such that: the discharge member has a plurality of discharge openings formed along an axis direction of the cylindrical member, and discharges the heating medium toward the inner peripheral surface through the plurality of discharge openings.

In the above configuration, the plurality of discharge openings is formed along the axis direction of the cylindrical member so as to discharge the heating medium toward the inner peripheral surface of the cylindrical member. As a result, the outer peripheral surface of the cylindrical member can have a thermal distribution arranged to be more strictly uniform in the width direction.

The heating roller in accordance with an embodiment of the present invention is preferably arranged such that: the cylindrical member is provided with an outlet for ejecting the heating medium, the outlet being formed at one end surface of the cylindrical member; and the discharge member has a cylindrical shape and is inserted into the cylindrical member through the outlet.

The above configuration allows a configuration for assembling the discharge member into the cylindrical member by inserting the discharge member into the cylindrical member through the outlet, to be an uncomplicated and simple configuration.

In order to solve the above problems, a heating roller in accordance with an embodiment of the present invention includes: a cylindrical member for heating a film, with a heating medium which is supplied into the cylindrical member and ejected from inside the cylindrical member, the film being wrapped on an outer peripheral surface of the cylindrical member; and a discharge member for discharging, toward one end surface of the cylindrical member, the heating medium which is supplied into the cylindrical member, the discharge member separating the heating medium into portions and discharging the portions of the heating medium respectively at a first discharge position and a second discharge position, the first discharge position and the second discharge position being arranged such that a distance from the second discharge position to the one end surface is longer than a distance from the first discharge position to the one end surface.

With the above feature, a portion of the heating medium supplied inside the cylindrical member by the discharge member and moving toward the first discharge position is separated and discharged at the second discharge position. Accordingly, the heating medium discharged at the first discharge position decreases in amount by the amount of the portion of the heating medium separated for discharge at the second discharge position. This suppresses a rise in temperature on a side corresponding to the one end surface, which rise in temperature is caused by the heating medium discharged at the first discharge position toward the one end surface of the outer peripheral surface. Accordingly, the outer peripheral surface of the cylindrical member of the drying roller can have a nearly uniform thermal distribution along the width direction. As a result, it is possible to heat a film wrapped on the outer peripheral surface of the cylindrical member, nearly uniformly in the width direction.

The heating roller in accordance with an embodiment of the present invention is preferably arranged such that: the discharge member further separates the heating medium so as to give another portion of the heating medium, and discharges the another portion of the heating medium at a third discharge position toward the one end surface of the cylindrical member; and the second discharge position and the third discharge position are arranged such that a distance from the third discharge position to the one end surface is longer than the distance from the second discharge position to the one end surface.

In the above configuration, another portion of the heating medium supplied inside the cylindrical member by the discharge member and moving toward the first discharge position is further separated and discharged at the third discharge position. Accordingly, the heating medium discharged at the first discharge position decreases in amount by the amounts of the portions of the heating medium separated for discharge at the second discharge position and the third discharge position. This further suppresses a rise in temperature on the side corresponding to the one end surface, which rise in temperature is caused by the heating medium discharged at the first discharge position toward the one end surface of the outer peripheral surface. Accordingly, the outer peripheral surface of the cylindrical member of the drying roller can have a more uniform thermal distribution along the width direction.

In order to solve the above problems, a heating roller in accordance with an embodiment of the present invention includes: a cylindrical member for heating a film, with a heating medium which is supplied into the cylindrical member and ejected from inside the cylindrical member, the film being wrapped on an outer peripheral surface of the cylindrical member; and a discharge member for discharging, inside the cylindrical member, the heating medium toward one end surface of the cylindrical member, the cylindrical member having a peripheral wall which is thicker on a side (one end surface side) corresponding to the one end surface of the cylindrical member than on another side (the other end surface side) corresponding to the other end surface of the cylindrical member.

With the above feature, the peripheral wall of the cylindrical member is arranged to be thicker on the one end surface side of the cylindrical member than on the other end surface side of the cylindrical member. This allows the peripheral wall to have a higher thermal resistance on the one end surface side than on the other end surface side. Meanwhile, the heating medium discharged toward the one end surface through a discharge opening flows from the one end surface side toward the other end surface side, while being in contact with the peripheral wall and cooled. Accordingly, the temperature of the heating medium in convention on the one end surface side of an inner peripheral surface is higher than the temperature of the heating medium in convention on the other end surface side of the inner peripheral surface. Since the peripheral wall has a larger thermal resistance on the one end surface side than the other end surface side, a temperature distribution is more uniform in a width direction on the outer peripheral surface of the cylindrical member. As a result, it is possible to heat the film, which is wrapped on the outer peripheral surface of the cylindrical member, nearly uniformly in the width direction.

The heating roller in accordance with an embodiment of the present invention can be arranged such that: the discharge member discharges the heating medium toward the one end surface, the heating medium being discharged at a position where a distance to the one end surface is shorter than a distance to the other end surface.

In the above configuration, a distance to one end surface from the discharge member is shorter than a distance to the other end surface from the discharge member. Accordingly, the heating medium discharged from the discharge member is prevented from moving to an outlet side via a shortcut, not reaching the inner peripheral surface of the cylindrical member.

In order to solve the above problems, a film production method in accordance with an embodiment of the present invention includes the steps of: supplying a heating medium into a heating roller in accordance with an embodiment of the present invention and ejecting the heating medium from inside the heating roller; and heating a film by wrapping the film on an outer peripheral surface of a cylindrical member of the heating roller.

In the film production method in accordance with the present invention, the film can be a separator for lithium ion secondary batteries.

The present invention is not limited to the above-described embodiments, but can be altered by a skilled person in the art within the scope of the claims. An embodiment derived from a proper combination of technical means each disclosed in a different embodiment is also encompassed in the technical scope of the present invention.

REFERENCE SIGNS LIST 12b separator original sheet (film)
21 drying device
22 drying roller (heating roller)
23 cylindrical member
24 discharge pipe (discharge member)
25 outlet member
26 discharge opening
27, 28, 29 discharge branch
30 outlet
32 discharge opening (third discharge opening)
33 discharge opening (second discharge opening)
34 discharge opening (first discharge opening)
S1, S2 inner end surface (one end surface, the other end surface)
S3 outer peripheral surface
S4 inner peripheral surface
H hot water (heating medium, heating medium fluid)

The invention claimed is:

1. A film production method comprising the steps of:
supplying a heating medium into a heating roller and ejecting the heating medium from inside the heating roller, the heating roller comprising:
a cylindrical member for heating a film, the cylindrical member having a first inner end surface and an opposing second inner end surface, with a heating medium which is supplied into the cylindrical member and ejected from inside the cylindrical member, the first inner end surface extending in a plane that is perpendicular to an outer peripheral surface of the cylindrical member; and
a discharge member for discharging, inside the cylindrical member, the heating medium toward the first inner end surface of the cylindrical member, the heating medium being introduced into the cylindrical member through the second inner end surface of the cylindrical member and being discharged from a discharge opening of the discharge member, a distance between the discharge opening and the first inner end surface of the cylindrical member being longer than a distance between the discharge opening and the second inner end surface of the cylindrical member; and
heating the film by wrapping the film on the outer peripheral surface of the cylindrical member of the heating roller.

2. The film production method as set forth in claim 1, wherein:
the film is a separator for a lithium ion secondary battery.

3. A film production method comprising the steps of:
supplying a heating medium into a heating roller and ejecting the heating medium from inside the heating roller, the heating roller comprising:
a cylindrical member for heating a film, the cylindrical member having a first end surface and an opposing second end surface and a peripheral wall extending between the first and second end surfaces, the peripheral wall having an inner peripheral surface and an outer peripheral surface, with a heating medium which is supplied into the cylindrical member so as to fill the cylindrical member and ejected from inside the cylindrical member, the film being wrapped on an outer peripheral surface of the cylindrical member; and
a discharge member for discharging, inside the cylindrical member, the heating medium toward the inner peripheral surface of the cylindrical member, the cylindrical member rotating on a center longitudinal axis of the cylindrical member relative to the discharge member in response to transfer of the film, the discharge member being fixed and not rotated on the center longitudinal axis, and the discharge member discharging the heating medium toward the inner peripheral surface from a position coinciding with the center longitudinal axis of the cylindrical member and from a position between the first end surface and the second end surface of the cylindrical member; and
heating the film by wrapping the film on an outer peripheral surface of the cylindrical member of the heating roller.

4. The film production method as set forth in claim 3, wherein:
the film is a separator for a lithium ion secondary battery.

5. A film production method comprising the steps of:
supplying a heating medium into a heating roller and ejecting the heating medium from inside the heating roller, the heating roller comprising:
a cylindrical member for heating a film, with a heating medium which is supplied into the cylindrical member and ejected from inside the cylindrical member; and
a discharge member for discharging, toward one end surface of the cylindrical member, the heating medium which is supplied into the cylindrical member, the discharge member separating the heating medium into portions and discharging the portions of the heating medium respectively at a first discharge position and a second discharge position,
the first discharge position and the second discharge position being arranged such that a distance from the first discharge position to the one end surface is longer than a distance from the second discharge position to the one end surface,
the discharge member including a first discharge branch extending along a center axis of the cylindrical member, and a second discharge branch which branches from the first discharge branch and extends in a direction parallel to the center axis of the cylindrical member, the first discharge position being located at a first discharge opening at a tip of the first discharge branch, the second discharge position being located at a second discharge opening at a tip of the second discharge branch; and heating the film by wrapping the film on an outer peripheral surface of the cylindrical member of the heating roller.

6. The film production method as set forth in claim 5, wherein:

the film is a separator for a lithium ion secondary battery.

7. A film production method comprising the steps of:

supplying a heating medium into a heating roller and ejecting the heating medium from inside the heating roller, the heating roller comprising:

a cylindrical member for heating a film, with a heating medium which is supplied into the cylindrical member and ejected from inside the cylindrical member, the film being wrapped on an outer peripheral surface of the cylindrical member, the cylindrical member including a peripheral wall having the outer peripheral surface, a first inner end surface at a first end of the peripheral wall and a second inner end surface at a second end of the peripheral wall, the peripheral wall being thicker at the first end than at the second end, the first inner end surface extending in a plane that is perpendicular to an outer peripheral surface of the cylindrical member; and a discharge member having a cylindrical shape and being inserted inside the cylindrical member, the discharge member being configured to discharge the heating medium toward the first inner end surface of the cylindrical member; and heating the film by wrapping the film on an outer peripheral surface of the cylindrical member of the heating roller.

8. The film production method as set forth in claim 7, wherein:

the film is a separator for a lithium ion secondary battery.

* * * * *